(12) United States Patent
Wang et al.

(10) Patent No.: US 10,684,499 B2
(45) Date of Patent: Jun. 16, 2020

(54) SPLICING SCREEN, FABRICATING METHOD AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Mingchao Wang, Beijing (CN); Junwei Wang, Beijing (CN); Dongxi Li, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/506,232

(22) PCT Filed: May 20, 2016

(86) PCT No.: PCT/CN2016/082901
§ 371 (c)(1),
(2) Date: Feb. 23, 2017

(87) PCT Pub. No.: WO2017/117894
PCT Pub. Date: Jul. 13, 2017

(65) Prior Publication Data
US 2019/0086703 A1    Mar. 21, 2019

(30) Foreign Application Priority Data

Jan. 4, 2016 (CN) .......................... 2016 1 0005511

(51) Int. Cl.
*H01L 27/32* (2006.01)
*G02F 1/1333* (2006.01)
(Continued)

(52) U.S. Cl.
CPC .... *G02F 1/13336* (2013.01); *G02F 1/133308* (2013.01); *G02F 1/133512* (2013.01);
(Continued)

(58) Field of Classification Search
None
See application file for complete search history.

(56) References Cited

U.S. PATENT DOCUMENTS 9,660,403 B2 *   5/2017   Hochman ................. G09G 5/02
9,924,604 B2 *   3/2018   Drabant ............... H05K 5/0021
(Continued)

FOREIGN PATENT DOCUMENTS

CN        103969864 A      8/2014
CN        104751747 A      7/2015
(Continued)

OTHER PUBLICATIONS

SIPO Decision of Rejection dated Jan. 6, 2017 in CN 201610005511.1.
(Continued)

*Primary Examiner* — Abul Kalam
(74) *Attorney, Agent, or Firm* — Syncoda LLC; Feng Ma

(57) ABSTRACT

A splicing screen includes: at least two display panels spliced together, each display panel having a display surface; a curved area bending towards a back side of the display surface at a splicing area; and a substantially flat area; a transparent cover disposed at a side of the display surface and covering at least the curved area of each display panel; and a plurality of support portions between the transparent cover and the curved area of each of the display panels and forming a plurality of meshes extending from the display panel to the transparent cover, an inner wall of each mesh having a reflective surface.

16 Claims, 6 Drawing Sheets

(51) Int. Cl.
*G02F 1/1335* (2006.01)
*H01L 25/075* (2006.01)
*H01L 51/52* (2006.01)
*G02F 1/1341* (2006.01)
*H01L 51/00* (2006.01)

(52) U.S. Cl.
CPC .... *G02F 1/133553* (2013.01); *H01L 25/0753* (2013.01); *H01L 27/3293* (2013.01); *H01L 51/5237* (2013.01); *H01L 51/5271* (2013.01); *G02F 1/1341* (2013.01); *G02F 1/133305* (2013.01); *H01L 51/0097* (2013.01)

(56) References Cited

U.S. PATENT DOCUMENTS

| | | | |
|---|---|---|---|
| 2014/0071657 A1* | 3/2014 | Sekiguchi | G02F 1/1333 362/97.1 |
| 2015/0286457 A1 | 10/2015 | Kim et al. | |
| 2016/0363291 A1 | 12/2016 | Sun et al. | |
| 2017/0086308 A1* | 3/2017 | Large | H05K 5/0017 |
| 2017/0220310 A1* | 8/2017 | Hochman | G06F 3/1446 |
| 2017/0243810 A1* | 8/2017 | Smith | H01L 27/1218 |

FOREIGN PATENT DOCUMENTS

| | | |
|---|---|---|
| CN | 104978901 A | 10/2015 |
| CN | 105448198 A | 3/2016 |
| EP | 2133854 A1 | 12/2009 |
| JP | 2002297066 A | 10/2002 |

OTHER PUBLICATIONS

SIPO Decision of Review dated Oct. 31, 2017 in CN 201610005511.1.
International Search Report and Written Opinion dated Sep. 27, 2016 in PCT/CN2016/082901.
First Office Action dated Jul. 29, 2016 in parent CN201610005511.1.
Extended European Search Report dated Jun. 13, 2019 EP16812664.7.

* cited by examiner

SPLICING SCREEN, FABRICATING METHOD AND DISPLAY APPARATUS

CROSS-REFERENCE TO RELATED APPLICATION

The present application claims priority to Chinese Patent Application No. 201610005511.1 filed on Jan. 4, 2016, the disclosure of which is hereby incorporated by reference in its entirety.

TECHNICAL FIELD

The present disclosure relates to the field of display technologies, and more specifically to a splicing screen, its fabricating method and a display apparatus.

BACKGROUND

Splicing screen technology is an effective approach to achieve large-sized display apparatuses. Existing splicing screens usually employ multiple flat display panels, such as existing thin-film transistor (TFT) liquid crystal displays (LCDs), for splicing.

SUMMARY

Various embodiments of the present disclosure provide a splicing screen and its fabricating method, and a display apparatus, to achieve substantially seamless splicing screen.

In an aspect, a splicing screen is provided, comprising: at least two display panels spliced together, each display panel having: a display surface; a curved area bending toward a back side of the display surface at a splicing area; and a substantially flat area; a transparent cover at a side of the display surface and covering at least the curved area of each display panel; and a plurality of support portions between the transparent cover and the curved area of each of the display panels and forming a plurality of meshes extending from the display panel to the transparent cover, an inner wall of each mesh having a reflective surface.

In some embodiments, an outer surface of the transparent cover comprises a rough surface.

In some embodiments, for each display panel the rough surface is over the curved area. For example, only areas of the outer surface corresponding to the curved areas of the display panels are roughened.

In some embodiments, each mesh extends in a direction perpendicular to the transparent cover.

In some embodiments, each mesh has an opening area corresponding to at least one sub-pixel.

In some embodiments, contact areas between the support portions and the display surface of the curved area are in regions corresponding to a black matrix at gaps between the sub-pixels on the display surface of the curved area.

In some embodiments, the contact areas substantially overlap with the regions corresponding to the black matrix located at the gaps.

In some embodiments, the inner wall of each mesh is coated with a reflective material.

In some embodiments, the transparent cover covers the display surface of each display panel entirely.

In some embodiments, the splicing screen further comprises at least one support member between the transparent cover and the display surface of the flat area of each of the display panels.

In some embodiments, projections of the plurality of support members over the display surface are in regions corresponding to a black matrix at gaps between sub-pixels on the display surface of the curved area.

In some embodiments, the plurality of support members are distributed evenly on the display surface of the flat area of the display panel.

In some embodiments, each of the plurality of support members has a column shape.

In some embodiments, the plurality of support portions and the plurality of support members comprise an elastic material.

In some embodiments, the display panel is any one of a liquid crystal display panel, a light-emitting diode display panel, an organic light-emitting diode display, an organic electroluminescence display panel, a cathode ray tube display panel, a plasma display panel, an electronic paper, and an electroluminescent display panel.

In another aspect, a method of fabricating a splicing screen is provided, comprising: providing at least two display panels each having a display surface, a transparent cover, and a plurality of support portions having a plurality of meshes; performing a splicing process after bending a side of each of the plurality of display panels towards a back of the display surface; placing the plurality of support portions between the transparent cover and the display surface of a curved area of each of the display panels for coupling to form a splicing screen.

In some embodiments, the coupling comprises encasing alignment.

In some embodiments, the method further comprises roughening an outer surface of the transparent cover.

In some embodiments, the method further comprises depositing a reflective material over inner walls of the plurality of meshes.

In some embodiments, the method further comprises disposing a plurality of support members over the display surface of the flat area of each of the display panels.

In another aspect, a display apparatus is provided comprising the splicing screen.

Other embodiments and implementations may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments and are not intended to limit the scope of the present disclosure. For those of ordinary skill in the art, other drawings of other embodiments can become apparent based on these drawings. The size and shape of each component in the drawings do not necessarily reflect the real proportion of the apparatus and its fabricating method.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

In conventional splice screens, packaging sealant and peripheral distribution of lines on each of the display panels can result in non-display areas, for example in the splicing zones of adjacent display panels, i.e., splicing gaps. To reduce the size of the areas occupied by the splicing gaps, efforts have been focused on reducing the size of non-display areas of the display panels, including designs of a variety of narrow-boarder products and even borderless products.

However, due to the presence of the packaging sealant (seal agent), the non-display areas of the display panels cannot be completely eliminated. As such, in the current splicing approaches, seamless splicing in the real sense cannot be achieved. Further, for narrow-boarder products, because the distance between the display panel and the sealant is too small, it is also prone to a variety of adverse results such as image sticking, liquid crystal leakage, lead corrosion, etc.

Figure 1:
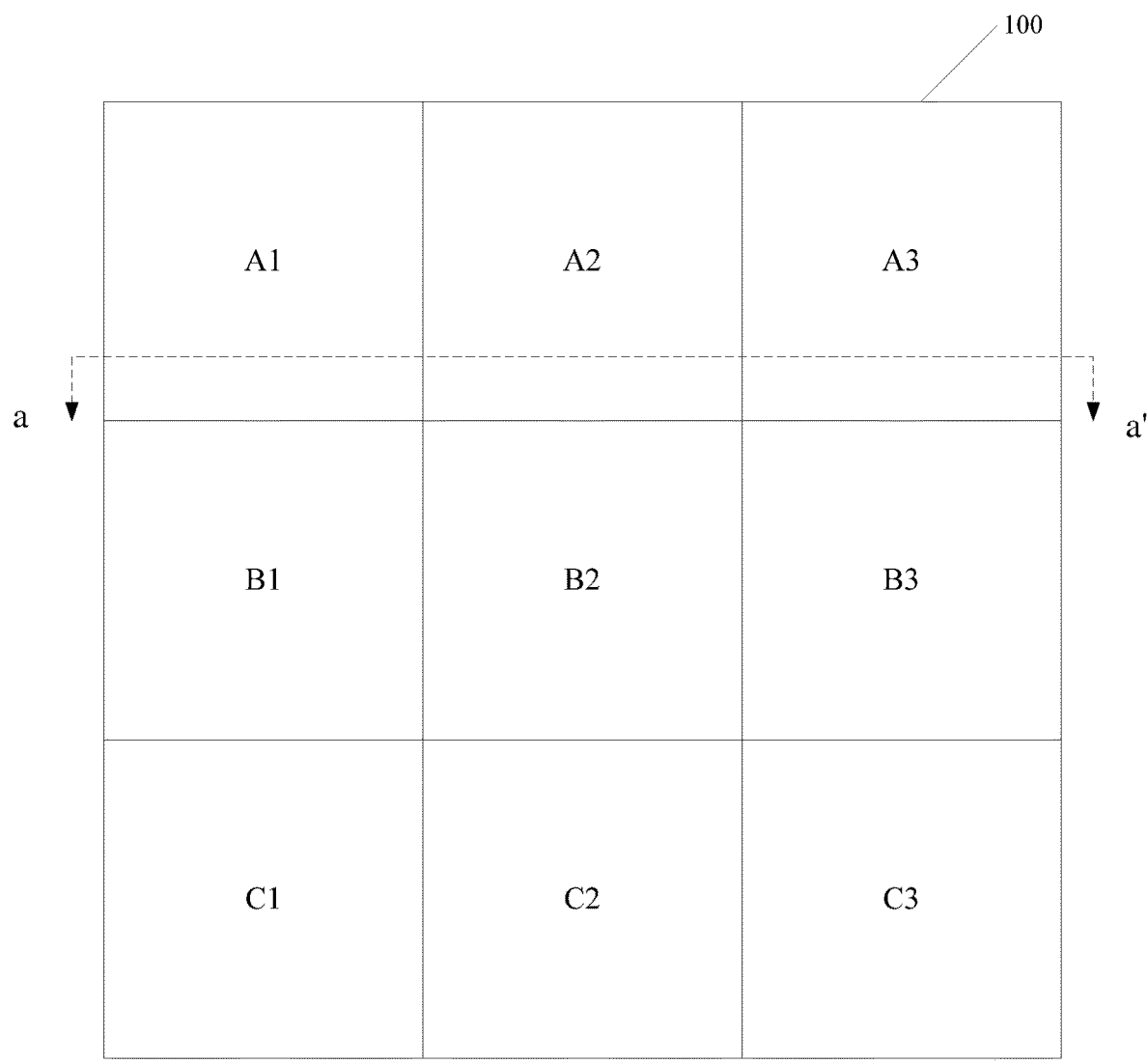
FIG. 1 is a top plan view of a splicing screen according to some embodiments.
Figure 2:
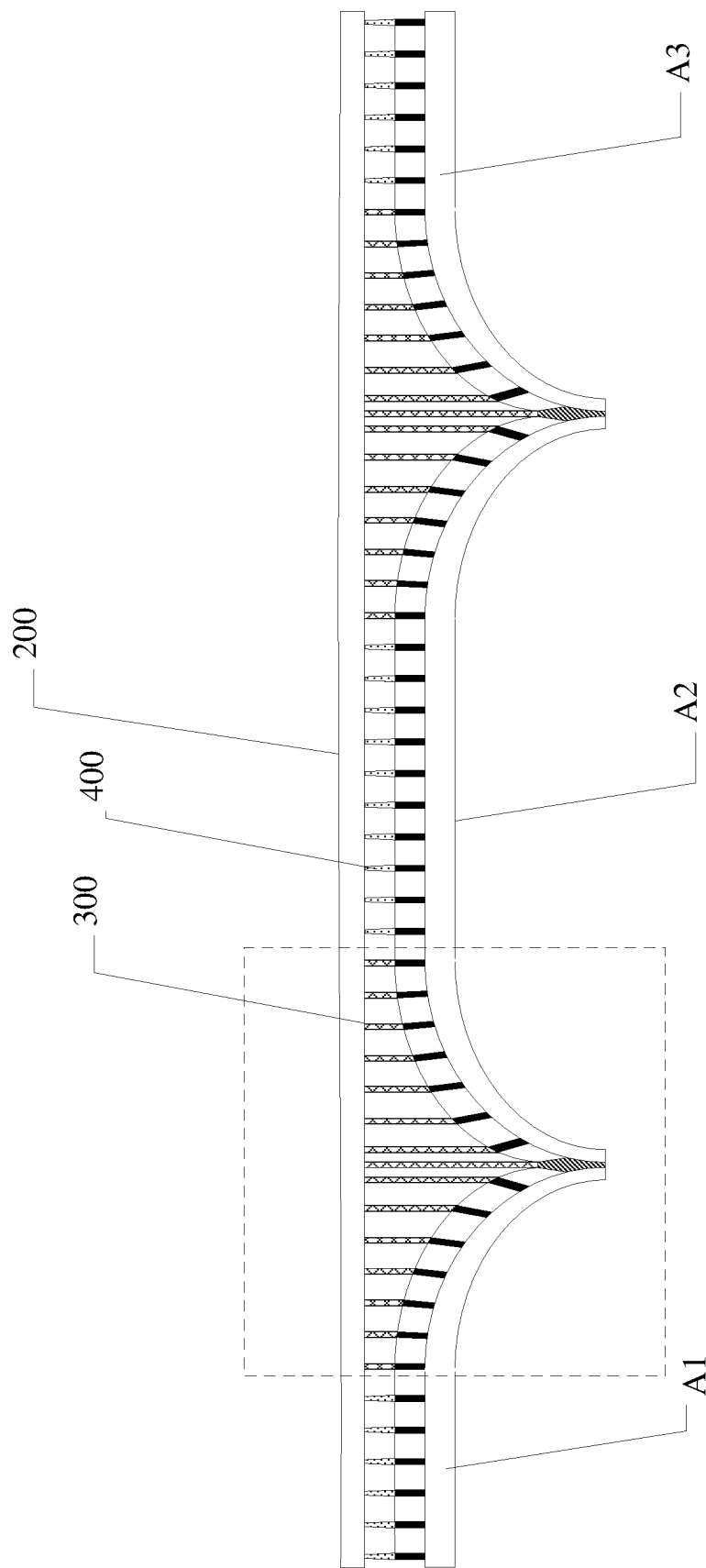
FIG. 2 is a cross-sectional view of the structure of along the a-a' line in FIG. 1.

Some embodiments provided herein provide a splicing screen, as illustrated in FIG. 1 and FIG. 2. The splicing screen can be part of a display apparatus, comprising at least two display panels 100 that are spliced together. Each display panel 100 comprises a curved area and a flat area. The curved area at the splicing area can be bent towards the back of the display surface.

As shown in the example in FIG. 1, 3×3 display panels 100 are spliced together to form a splicing screen of the display apparatus. FIG. 2 is a cross-sectional view of display panels numbered A1, A2, and A3 along the a-a' line, across the splicing area between the edges of display panels A1 and A2, and the splicing area between the edges of display panels A2 and A3. As illustrated in FIG. 2, a transparent cover 200 can be disposed over the display surface of each of the display panels, and at least cover the curved area of each of the display panels 100. In some embodiments, the transparent cover 200 covers only the curved areas. In some other embodiments, the transparent cover 200 covers all the display panels 100 in their entirety.

Figure 3:
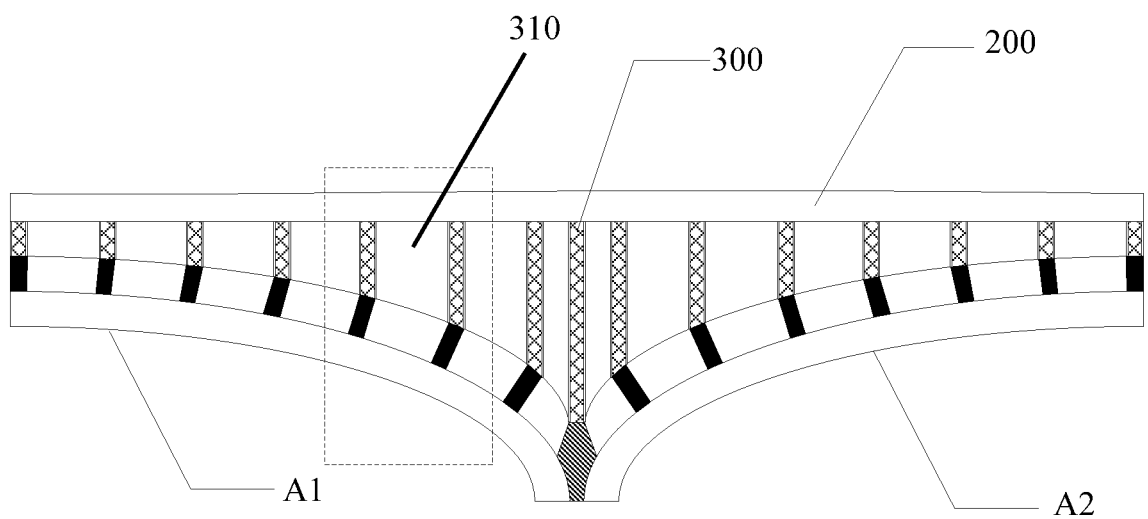
FIG. 3 is an enlarged view of the dotted box area in FIG. 2.

FIG. 3 is an enlarged view of the dotted box area in FIG. 2. As shown in FIG. 2 and FIG. 3, a plurality of support portions 300 are arranged between the transparent cover 200 and the curved areas of each of the display panels 100. The plurality of support portions 300 can form a plurality of meshes 310. Transparent cover 200 can be, for example, a transparent plane body, or can have other shapes. Each mesh 310 can extend from display panel 100 to transparent cover 200. The inner wall of each mesh 310 can comprise a reflective surface.

Figure 4:
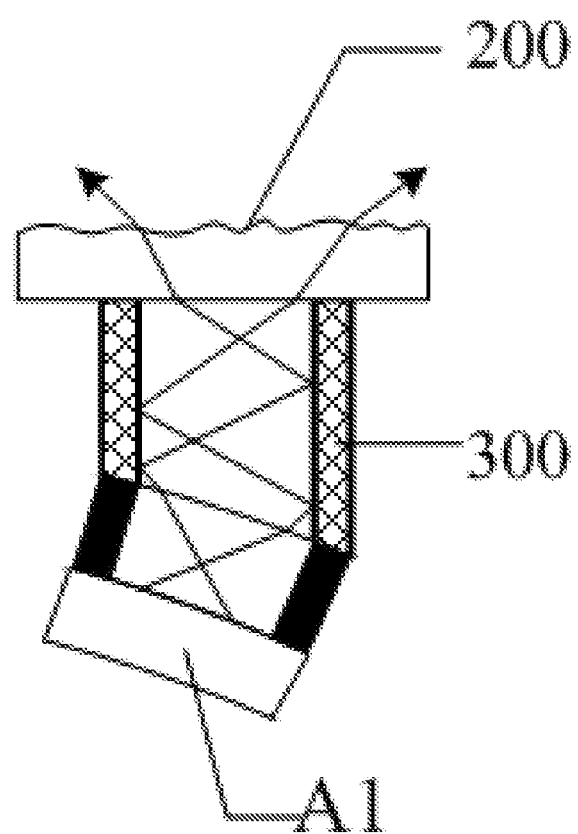
FIG. 4 is an enlarged view of the dotted box area in FIG. 3.

In the above-described splicing screen according to some embodiments, the light emitted from the curved area of each of the display panels 100 can be reflected multiple times by the inner wall of mesh 310 of support portion 300, as illustrated in FIG. 4. After being scattered by transparent cover 200 that covers the curved area of the display panel 100, the light can enter the eyes of the viewers, thus achieving display at the peripheral regions of the splice of each of the display panels 100, and thereby achieving seamless splicing with a substantially zero splicing gap.

In some embodiments, the extending direction of mesh 310 arranged in support portions 300 can be perpendicular to the plane of the transparent cover as shown in FIG. 2. In some other embodiments, the extending direction can be at a predetermined angle with the plane of transparent cover 200. For example, the extending direction of each mesh 310 can be leaned towards to the vertical direction that is perpendicular to the plane of transparent plane body 200. In some embodiments, the extending direction of each mesh 310 can be along a straight line, as shown in the example in FIG. 2. In some other embodiments, the extending direction can be along a curved line.

In some embodiments, the size of mesh 310 can be designed according to desired processing and display accuracy. For example, in order not to affect the display effect at the curved area of display panel 100, as shown in FIG. 3, support portions 300 can have an opening area corresponding to a region of the curved area corresponding to at least one sub-pixel.

Further, the contact area between support portion 300 and the display surface of the curved area of display panel 100 can be located in a region corresponding to a black matrix (BM), which is located at the gaps between the sub-pixels on the display surface of the curved area of display panel 100.

As shown in FIG. 3, according to some embodiments, support portions 300 can be preferably disposed such that a mesh 310 opening region corresponds to a sub-pixel area of display panel 100. For example, the contact area between support portion 300 and the display surface of the curved area of display panel 100 overlaps with the area corresponding to the black matrix at the gap between each sub-pixels on the display surface of the curved area of display panel 100.

Figure 5:
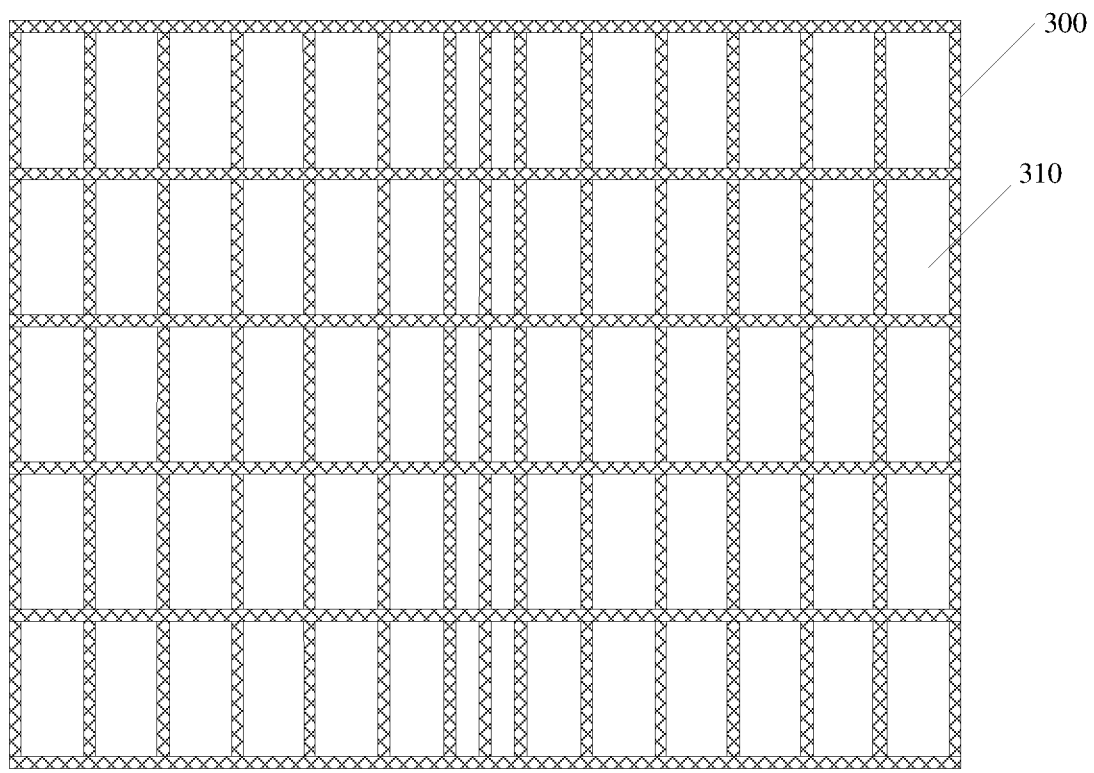
FIG. 5 is a top plan view of the structure illustrated in FIG. 3.

FIG. 4 is an enlarged view of the dotted box area in FIG. 3. FIG. 5 is a top plan view of the structure in FIG. 3. In some embodiments, column-shaped support structures can be adopted for support portions 300. In some other embodiments, support portions 300 can have other shapes, such as having a circular, rectangular, or triangular cross section. For example, in some embodiments support portions can have shapes of prisms with reflective surfaces. The plurality of support portions 300 can be distributed with a pitch corresponding to the size of a sub-pixel.

In some embodiments, for the light emitted from display panel 100 to be reflected into transparent cover 200 by the inner wall of each mesh 310 of support portions 300, the inner wall of each mesh 310 can be a reflective surface. For example, a reflective material can be employed to manufacture support portions 300. The inner wall of each mesh 310 in support portions 300 can be polished to achieve the effect of reflecting light. In some embodiments, a reflective material can be formed over the inner wall of each mesh 310 after support portions 300 are fabricated, by forming separately a thin film layer with good reflective characteristics. The thin film layer can be deposited, for example, with a sputtering or a plating process.

In some embodiments, transparent cover 200 can be configured to only cover the curved area of each of the display panels 100. For example, transparent cover 200 can be disposed only at the curved splice area of each of the display panels 100, but not at the flat area of display panel 100. In this case, in order for support portions 300 under transparent cover 200 not being easily visible to viewers, as shown in FIG. 4, the outer surface of transparent cover 200 can be made a rough surface to facilitate diffused reflection of the emitted light at the outer surface of transparent cover 200.

In some embodiments, as shown in FIG. 2, the entire display surface of each of the display panels 100 can be covered by transparent cover 200. That is, in addition to covering the curved area of each of the display panels 100, the flat area of each of the display panel 100 can also be covered.

In this case, in order to make it not easy for the viewers to see support portion 300 under transparent cover 200, the entire outer surface of transparent cover 200 can be made a rough surface.

In some other embodiments, for each display panel the rough surface is over the curved area. For example, only the portion of outer surface of transparent cover 200 corresponding to the curved area of each of the display panels 100 is made a rough area to facilitate diffused reflection of the emitted light at the outer surface of transparent cover 200. In some embodiments, for example, roughening may be performed to a partial outer surface of the transparent cover 200 to ensure its outer surface has a rough area.

It should be noted that according to some embodiments, the outer surface of transparent cover 200 refers to the side of transparent cover 200 that is not in contact with support portion 300.

In some embodiments, when employing transparent cover 200 to cover the entire display surface of each of the display panels 100, there may be a gap between transparent cover 200 and the flat area of each of the display panels 100. To achieve a better coupling between transparent cover 200 and each of the display panels 100, as shown in FIG. 2, at least one support member 400 can be disposed between transparent cover 200 and the display surface of the flat area of each of the display panels 100. In some embodiments, column-shaped support structures can be adopted for support member 400. In some other embodiments, support member 400 can have other shapes, such as having a circular, rectangular, or triangular cross section.

In some embodiments, in order for support member 400 not to affect a normal displaying by each of the display panels 100, as shown in FIG. 2, support member 400 can be disposed at an area corresponding to the black matrix. For example, the projection of support member 400 can be over the display surface of the flat area of display panel 100, located in the area corresponding to the black matrix at the gap between each of the sub-pixels on the display surface of the flat area of display panel 100. For example, support member 400 can be disposed at the gap between each of the sub-pixel. In some other embodiments, a support member 400 can be disposed for every several sub-pixels.

In some embodiments, a plurality of support members 400 can be distributed evenly over the display surface of the flat area of display panel 100.

In some embodiments, support portions 300 disposed at the curved area of display panel 100 and support members 400 disposed at the flat area of display panel 100 can be manufactured with materials with a certain degree of elasticity. The material used for support portions 300 and the material used for support members 400 can be the same, or can be different. In an example, a Polystyrene (PS) material can be used.

In some embodiments, display panels 100 can be flexible screens. The degree of bending of each of the display panels 100 at the splicing area can be determined based on the types of the display panel 100 and the actual fabrication processes. In general, the wider the frame of display panel 100, the larger the degree of bending of display panel 100 at the splicing area can be achieved. The bending angles are not limited by the illustrative examples, but rather can be any angles permitted by the materials, the applications, and the fabrication processes.

Display panel 100 can be any one of an LCD panel, a light-emitting diode (LED) display panel, an organic light-emitting diode (OLED) display panel, a cathode ray tube (CRT) display panel, a plasma display panel, an e-paper, or an electroluminescent display panel. According to some embodiments, when display panel 100 is an LCD panel, the backlight module located at the back of the LCD can also be bent at the splicing area in accordance with the curved shape of the LCD panel.

Figure 6:
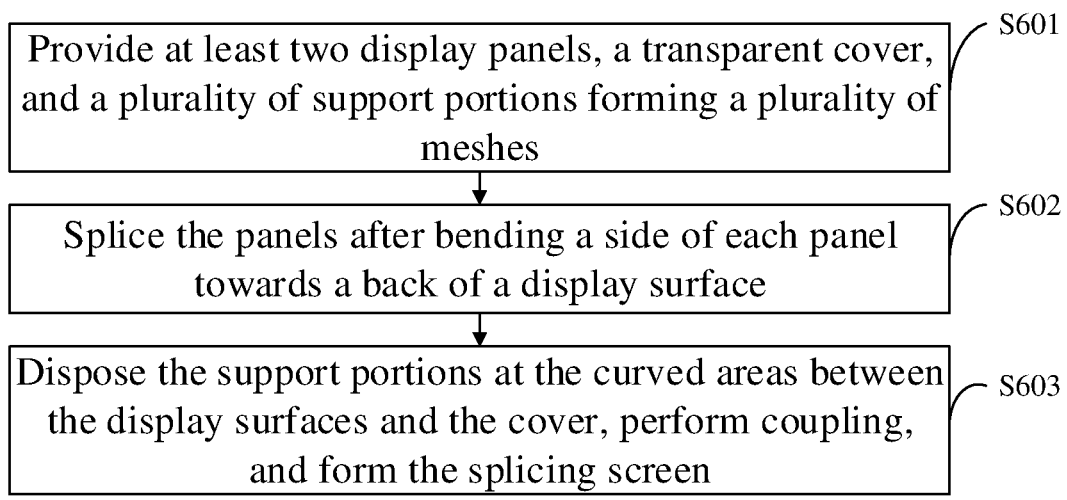
FIG. 6 is a schematic diagram of a fabricating process of the splicing screen according to some embodiments.

Embodiments of the present disclosure also provide a method of fabricating the display apparatus with the splicing screen. As illustrated in FIG. 6, an example method can include the following steps: S601, providing at least two flexible display panels, a transparent cover, and a plurality of support portion forming a plurality of meshes; S602, performing a splicing process after bending the side of each of the display panels towards the back of the display surface; S603, placing the support portions with meshes between the transparent cover and the display surface of the curved area of each of the display panels for coupling.

The coupling can include an encasing alignment process. For example, aligning and overlaying the transparent cover with the display panel can be performed first. The liquid crystal can then be injected, and the structure can be sealed with a sealant to form a liquid crystal cell. A splicing screen can therefore be produced.

In some embodiments, the method can further comprise performing roughening or scrubbing treatment to the outer surface of the transparent cover, to form a roughened surface, or a surface with roughened regions.

In some embodiments, the method can further comprise forming a reflective material over the inner wall of each mesh structure.

In some embodiments, the method can further comprise forming a plurality of support members 400 over the display surface of the flat area of each of the display panels.

In some embodiments, the fabricating method can include the following steps:

1. Fabricating a plurality of flexible display panels 100, which can be selected to have narrow borders or be borderless.

2. Performing a splicing process after bending the sides of each of the display panels 100 according to the desired shape and style of the splicing screen.

3. Fabricating a plurality of support portions forming meshes 310, and forming a reflective material over the inner wall of each mesh 310 by sputtering or electroplating processes. In some embodiments, meshes 310 of support portions 300 can have the opening area at where the sub-pixels in display panel 100 are located. In some embodiments, support portions 300 can be cut with a laser cutting process in order to ensure that heights of support portions 300 at each position equal the vertical spacing between transparent cover 200 and display panel 100.

4. Fabricating transparent cover 200, and performing roughening treatment over the outer surface of the transparent cover 200 to make it a rough surface or have roughened regions.

5. Fabricating support members 400 over the inner surface of transparent cover 200 or over the display surface of the flat area of each of the display panels 100. For example, Polystyrene material may be employed to fabricate support members 400.

6. Coupling transparent cover 200 with the splicing screen including the plurality of display panels. The coupling process may include, for example, an encasing alignment process. The frame (e.g., bezel) can be assembled surrounding the sides of the splicing screen to complete the fabrication of the splicing screen.

Embodiments of the present disclosure further provide a display apparatus, comprising the above-described splicing screen. The display apparatus can be part of a display system, including control electronics and power supplies.

Therefore, various embodiments of the present disclosure provides a splicing screen, comprising: at least two display panels that are spliced together, wherein each of the display panels comprises a curved area at the side of the splicing region bending towards the back of the display surface, and a flat area. A transparent cover is disposed at the side of the display surface of each of the display panels and covers at least the curved area of each of the display panels. A plurality of support portions can be disposed between the transparent cover and the curved area of each of the display panels and forming a plurality of meshes extending from the display panel to the transparent cover, an inner wall of each mesh having a reflective surface to reflect the light emitted from the curved area of each of the display panels toward the eyes of the viewers after the light is scattered by the transparent cover that covers the curved area of the display panel. As such, displaying at the peripheral regions of the splice areas of each of the display panels can be achieved, and thus achieving a seamless splicing with a substantially zero splicing gap.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A splicing screen, comprising:
   at least two display panels spliced together, each display panel having:
      a display surface;
      a curved area bending toward a back side of the display surface at a splicing area; and
      a transparent cover at a side of the display surface and covering at least the curved area of each display panel;
      a plurality of support portions between the transparent cover and the curved area of each of the display panels; and
      a plurality of meshes comprising the plurality of support portions and spaces between the plurality of support portions,
      an inner wall of each mesh having a reflective surface.

2. The splicing screen of claim 1, wherein an outer surface of the transparent cover comprises a rough surface.

3. The splicing screen of claim 2, wherein for each display panel the rough surface is over the curved area.

4. The splicing screen of claim 1, wherein each mesh extends in a direction perpendicular to the transparent cover.

5. The splicing screen of claim 1, wherein each mesh has an opening area corresponding to at least one sub-pixel.

6. The splicing screen of claim 5, wherein contact areas between the support portions and the display surface of the curved area are in regions corresponding to a black matrix at gaps between the sub-pixels on the display surface of the curved area.

7. The splicing screen of claim 6, wherein the contact areas substantially overlap with the regions corresponding to the black matrix at the gaps.

8. The splicing screen of claim 1, wherein the inner wall of each mesh is coated with a reflective material.

9. The splicing screen of claim 1, wherein the transparent cover covers the display surface of each display panel entirely.

10. The splicing screen of claim 1, further comprising at least one support member between the transparent cover and the display surface of a flat area other than the curved area of each of the display panels.

11. The splicing screen of claim 10, wherein projections of the plurality of support members over the display surface are in regions corresponding to a black matrix at gaps between sub-pixels on the display surface of the curved area.

12. The splicing screen of claim 10, wherein the plurality of support members are evenly on the display surface of the flat area of the display panel.

13. The splicing screen of claim 10, wherein each of the plurality of support members has a column shape.

14. The splicing screen of claim 10, wherein the plurality of support portions and the plurality of support members comprise an elastic material.

15. The splicing screen of claim 1, wherein the display panel is any one of a liquid crystal display panel, a light-emitting diode display panel, an organic light-emitting diode display, an organic electroluminescence display panel, a cathode ray tube display panel, a plasma display panel, an electronic paper, or an electroluminescent display panel.

16. A display apparatus comprising a splicing screen, wherein the splicing screen comprises:
   at least two display panels spliced together, each display panel having:
      a display surface;
      a curved area bending toward a back side of the display surface at a splicing area; and
      a transparent cover at a side of the display surface and covering at least the curved area of each display panel;
      a plurality of support portions between the transparent cover and the curved area of each of the display panels; and
      a plurality of meshes comprising the plurality of support portions and spaces between the plurality of support portions,
      an inner wall of each mesh having a reflective surface.

* * * * *